United States Patent
Lin (10) Patent No.: US 6,867,721 B1
(45) Date of Patent: Mar. 15, 2005

(54) SPECTRAL SHAPING DYNAMIC ENCODER FOR A DAC

(75) Inventor: Chia-Liang Lin, Union City, CA (US)

(73) Assignee: Realtek Semiconductor Corp, Hsinchu (TW)

( * ) Notice: Subject to any disclaimer, the term of this patent is extended or adjusted under 35 U.S.C. 154(b) by 0 days.

(21) Appl. No.: 10/669,307

(22) Filed: Sep. 23, 2003

(51) Int. Cl.[7] .............................................. H03M 1/66
(52) U.S. Cl. ........................ 341/144; 341/148; 341/150
(58) Field of Search ................................ 341/144, 148, 341/150, 154

(56) References Cited

U.S. PATENT DOCUMENTS

| | | | |
|---|---|---|---|
| 5,404,142 A | 4/1995 | Adams et al. ............... | 341/144 |
| 5,684,482 A | 11/1997 | Galton ........................ | 341/144 |
| 6,304,608 B1 | 10/2001 | Chen et al. .................. | 341/143 |

OTHER PUBLICATIONS

Welz, Jared; Galton, Ian; and Fogleman, Eric; "Simplified Logic for First–Order and Second–Order Mismatch–Shaping Digital–to–Analog Converters;" IEEE Transactions on Circuits and Systems—II Analog and Digital Signal Processing; vol. 48; No. 11; Nov. 2001; pp. 1014–1027.

*Primary Examiner*—Jean Bruner Jeanglaude
(74) *Attorney, Agent, or Firm*—Daniel J. Bedell; Smith-Hill and Bedell (57) ABSTRACT

A tree-structured dynamic encoder generates an N-bit encoder output word in response to each encoder input word of a sequence of encoder input words, such that the number of encoder output word bits of value 1 equals a value of the encoder input word and such that positions bits of value 1 within the N-bit encoder output word for each give value of encoder word varies with time. Some or all of the switching blocks produce more than two block output words in response to each block input word. The dynamic encoder includes a tree of switching blocks, each dynamically encoding a block input word into more than one block output words, each having fewer bits than the block input word. A sum of values of the output words of each switching block always equals a value of that block's input word. A switching block of the highest layer of the tree receives each successive encoder input word as its block input word, and each switching block of each layer of the tree other than a lowest layer supplies each of its at least two block output words as a block input word to a separate switching block of a next lower layer of the tree. Each switching block of the lowest layer of the tree generates single-bit block output words, each forming a separate bit of the N-bit encoder output word.

33 Claims, 8 Drawing Sheets

SPECTRAL SHAPING DYNAMIC ENCODER FOR A DAC

BACKGROUND OF THE INVENTION

1. Field of the Invention

The present invention relates in general to multiple-bit digital-to-analog encoders (DACs) and in particular, to a spectral shaping dynamic encoder for a DAC.

2. Description of Related Art

Delta-Sigma ADC Architecture

Figure 1:
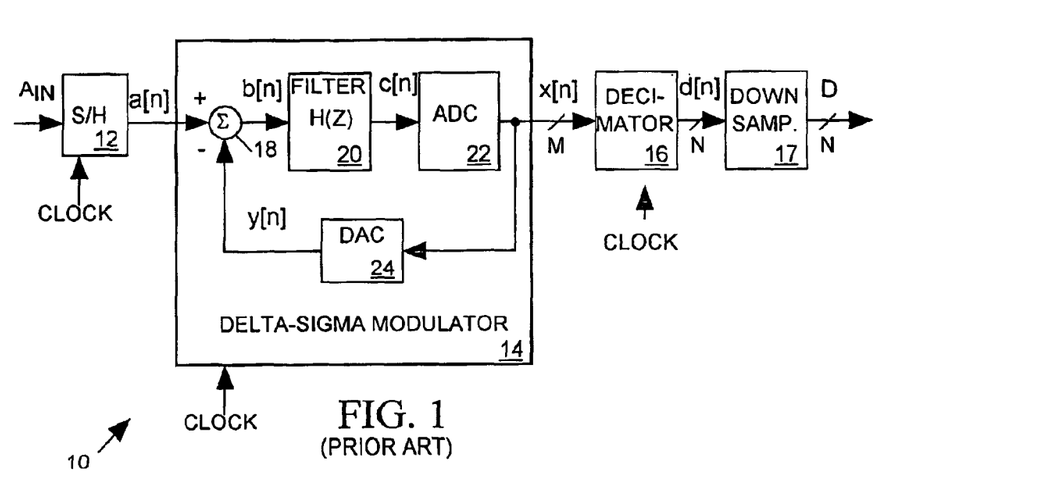
FIG. 1 illustrates a prior art delta-sigma analog-to-digital converter (ADC) in block diagram form.

FIG. 1 depicts a prior art delta-sigma analog-to-digital converter (ADC) 10 including a sample and hold (S/H) circuit 12, a delta-sigma modulator 14, and a digital decimator 16, for digitizing an analog input signal $A_{IN}$ to produce an output data sequence D representing the analog input signal. S/H circuit 12 samples the $A_{IN}$ signal on each pulse of a clock signal (CLOCK) at a rate much higher than the $A_{IN}$ signal bandwidth to produce a sequence of discrete analog samples a[n] supplied as input to delta-sigma modulator 14. Delta-sigma modulator 14 responds to each pulse of the CLOCK signal by generating an element of arm M-bit wide output sequence x[n]. When each element of the x[n] sequence is, for example, M=1 bit wide, delta-sigma modulator 14 sets the x[n] bit to a logical 1 increasingly more frequently than to a logical 0 as $A_{IN}$ increases in magnitude so that the density of 1's in the x[n] sequence is proportional to the magnitude of $A_{IN}$. When the x[n] sequence is more than one bit, delta-sigma modulator 14 generates higher values of x[n] more frequently as $A_{IN}$ increases. Decimator 16, a finite impulse response (FIR) filter, filters the x[n] X sequence to produce an N-bit wide sequence of elements $$d[n] = \sum_{i=-N1}^{N2} f[i] \cdot x[n-i]$$

where N1 and N2 are integers and FIR filter coefficients f[−N1]−f[N2] are numbers selected to give decimator 16 selected low pass or band pass characteristics to eliminate aliasing and out-of-band quantization noise. N is much larger than M. A down sampler 17 reduces the number of elements of the d[n] sequence by some factor p to produce an N-bit wide output sequence D. Thus, only every $p^{th}$ element of sequence d[n] sequence becomes an element of sequence D.

Figure 2:
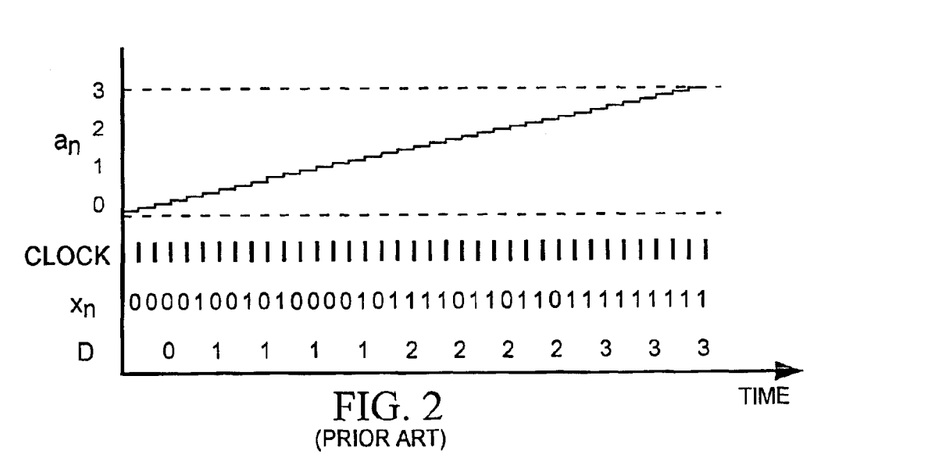
FIG. 2 is a timing diagram illustrating timing relationships between signals of the delta-sigma ADC of FIG. 1.

FIG. 2 is a timing diagram illustrating a simple example wherein p=3, i has values of the set {−1,0,1}, and all filter coefficients f[−1]=f[0]=f[1]=1. Thus in this example each element of sequence D is equal to a sum of a separate set three elements of the x[n] sequence, although in practice filter coefficients f will often have other values to provide a desired low pass or band pass filter characteristic.

Assume ADC 10, for example has an input range of 0–3 volts, and that as shown in FIG. 2, $A_{IN}$ signal ramps linearly from 0 to 3 volts during 36 CLOCK signal cycles. Signal x[n] step-wise approximates the $A_{IN}$ signal. The density of 1's represented by signal x[n] increases with the magnitude of x[n]. In this simple example, decimator 16 sums the preceding three x[n] sequence bits to produce each element of the d[n] sequence. In the example of FIG. 2, the output sequence D of ADC 10 represents input signal magnitude $A_{IN}$ with 2-bit resolution because the 2-bit wide elements of the D sequence can be any of $2^2$ values of the set {0,1,2,3}. We can increase the resolution of ADC 10 by increasing p. For example, when decimator 16 sums x[n] sequence elements during p=255 clock cycles, then elements of sequence D would be 8-bits wide and would represent 28 different signal magnitudes. However, to avoid aliasing, the CLOCK signal frequency should be at least p times the Nyquist frequency of the $A_{IN}$ signal.

Delta-sigma modulator 14 includes an analog summer 18, an analog filter 20 having a suitable discrete transfer function H(z), an M-bit ADC converter 22, and an M-bit digital-to-analog converter 24. Filter 20 filters the output signal b[n] of summer 18 to produce a signal c[n] and ADC 22 digitizes signal c[n] to produce the modulator output signal x[n]. For example when M=1, and c[n] is above a threshold level, ADC 22 sets x[n] to a 1, and otherwise sets x[n] to a 0 when c[n] is below the threshold level. DAC 24 drives its analog output signal y[n] to the maximum expected level of x[n] when x[n] is a 1 and drives y[n] to the minimum expected level of x[n] when x[n] is a 0. The feedback loop formed by devices 18–24 tries to keep c[n] at the threshold level of ADC 22 by driving x[n] to a 1 with a frequency that increases with the amplitude of $A_{IN}$. Modulator 14 operates in a generally similar manner when M>1 except that ADC 22 and DAC 24 adjust x[n] and y[n] with M-bit resolution.

Spectral Shaping

The feedback provided by DAC 24 spectrally shapes quantization errors of ADC 22 so that the errors mostly appear as high frequency components of x[n] outside the frequency range of x[n] and outside the pass band of decimator 16 so that the decimator can remove those spectrally shaped, out-of-band quantization errors. However, the feedback loop may not correct errors arising from any non-linearity of DAC 24. Ideally the output y[n] of DAC 24 should be a linear function of its input x[n] to avoid error components in y[n] within the pass band of decimator 16. Single-bit (M=1) delta-sigma data converters are popular because their 1-bit internal DACs are inherently linear, but a 1-bit data converter can achieve only relatively limited resolution for a given over-sampling ratio p. Sigma-delta modulator employing 1-bit DACs are also sensitive to timing errors such as sampling clock jitter and to other sources of error.

Multiplebit (M>1) DACs are not inherently linear, yet a higher resolution delta-sigma data converters can employ multiple-bit DACs by using "mismatch-shaping" to resolve problems associated with their nonlinear behavior. The nonlinearity of a multiple-bit DAC arises from mismatches in its internal components, and while a "mismatch-shaping" DAC exhibits nonlinear behavior, it shapes the error component frequencies of its output signal resulting from component mismatches so that they reside outside a frequency band of interest. Thus, when DAC 24 of FIG. 1 is a mismatch-shaping DAC, the frequency components of its output signal y[n] and of the output signal x[n] of delta-sigma modulator 14 resulting from the non-linear behavior of DAC 24 reside outside the frequency band of input signal a[n]. Decimator 16 can therefore filter those frequency components out of x[n], leaving data signal d[n] unaffected by the non-linear behavior of DAC 24.

Figure 3:
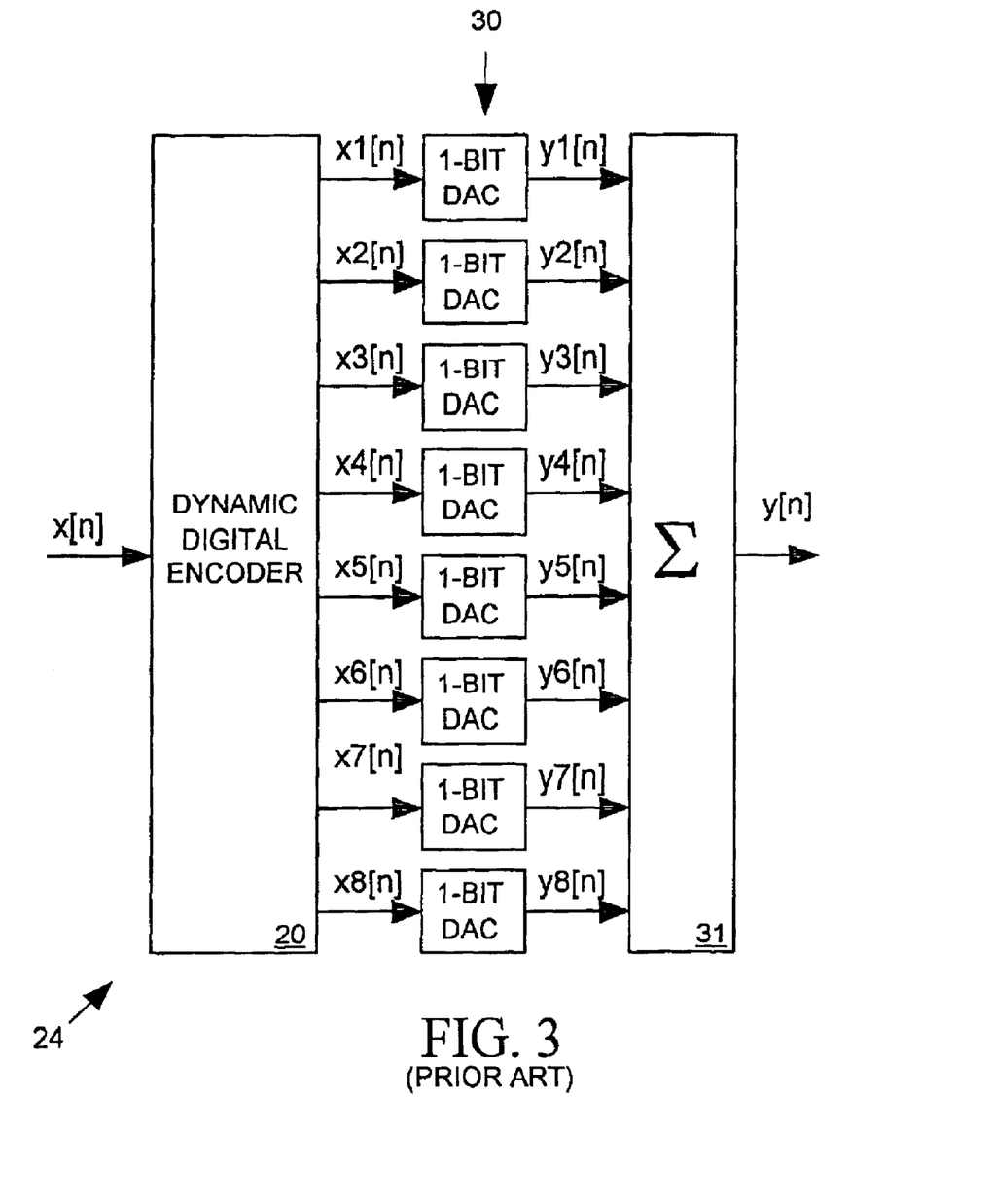
FIG. 3 is a block diagram of the prior art digital-to-analog converter (DAC) 24 of FIG. 1.

FIG. 3 depicts a typical prior art mismatch-shaping DAC 24 for converting a nine-level (3+ bit) input binary word x[n] into a nine-level output signal y[n]. The quantity n is a discrete time index. A dynamic digital encoder 20 converts data each $n^{th}$ incoming word x[n] into an 8-bit outgoing word {x1[n] ... x8[n]} wherein the number of bits of word {x1[n] ... x8[n]} that are 1's matches the value of input data word x[n]. A set of eight 1-bit DACs 30 converts each bit x1[n] ... x8[n] into a corresponding analog signal y1[n] ... y8[n], each residing at a high or low level depending on whether its corresponding data bit x1[n] . . . x8[n] is a 1 or a 0. A summing amplifier 31 sums the eight analog signals y1[n] . . . y8[n] to produce an analog output signal y[n] that may reside at any of nine levels. DAC 24 would be highly linear if all signals y1[n] . . . y8[n] had identical high and low levels and if summing amplifier 31 were to amplify all eight inputs equally when generating y[n]. But it is difficult to balance a summing amplifier 31 and to match a set of DACs 30 with sufficient precision to avoid significant nonlinearity in the relationship between x[n] and y[n]. However, a dynamic digital encoder 20 can shape the DAC's error due to component mismatches so that frequency components of output signal y[n] resulting from component mismatch reside outside a pass band of interest so that that a pass band filter can remove them from y[n] or any signal derived from it.

A "non-dynamic digital" encoder will always map each value of x[n] to the same value of its output word {x1[n] . . . x8[n]}. For example a non-dynamic digital encoder might always map x[n]=5 to {x1[n] . . . x8[n]}= {00011111}. In contrast, dynamic encoder 20 maps x[n]=5 to any one of many possible values of {x1[n] . . . x8[n]}. Four successive instances of input data x[n]=5 might result in four different successive values of word {x1[n] . . . x1[n]} such as for example {01001111}, {11010110}, {01110011}, and {11011100}. Since all of these values of bitset {x1[n] . . . x1[n]} have the same number (5) of bits set to a 1, summing amplifier 31 will drive output signal y[n] to the same nominal level in response to each bit set. But, when the 1-bit DACs 30 of FIG. 3 do not perfectly match one another, each of these values of bit set {x1[n] . . . x8[n]} can result in a slightly different value of y[n]. Dynamic digital encoder 20 therefore does not eliminate the error in y[n] due to the non-linearity of encoder but, when properly designed, it can vary bit positions of the 1's in its output word {x1[n] . . . x1[n]} in such a way that the error affects only high or low frequency components in y[n] that a subsequent processing stage can filter out.

An ideal dynamic digital encoder 20 appropriately shapes the error spectrum of output signal y[n] due to element mismatch using minimal hardware and produces its output word {x1[n] . . . x8[n]} with minimal path delay, thereby helping to minimize the total path delay through DAC 24. The path delay through a DAC 24 limits its operating frequency and can therefore limit the operating frequency of any sigma-delta converter having the DAC as a component. Designers have developed various architectures for dynamic digital encoders, each implementing a different dynamic element matching (DEM) technique, such as for example data weighted averaging (DWA), vector feedback, butterfly shuffling, and tree structuring, all of which are discussed in the paper "Simplified Logic for First-Order and Second-Order Mismatch-Shaping Digital-to-Analog Converters" by Welz et al, published in IEEE transactions on Circuits and Systems-II: Analog and Digital Signal Process, Vol. 48, No. 11, November 2001, incorporated herein by reference.

Figure 4:
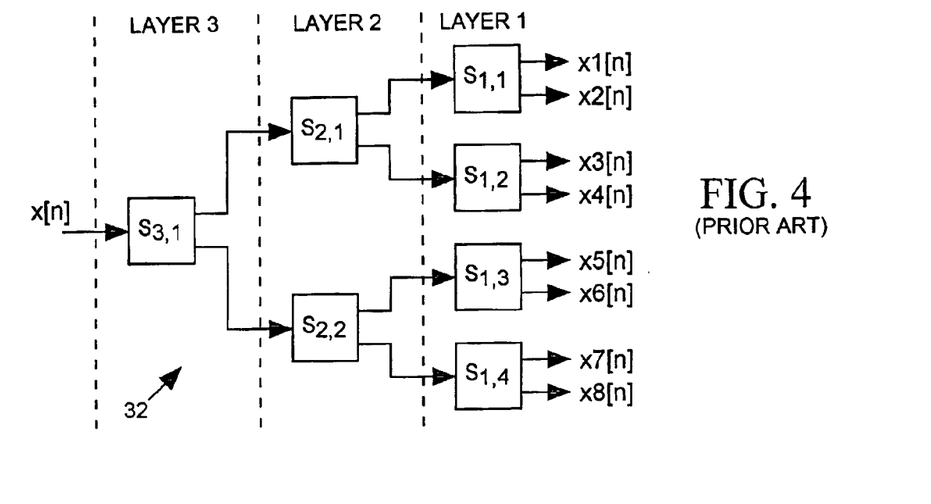
FIGS. 4–6 are block diagrams of the prior art dynamic digital encoder of the DAC of FIG. 3.

FIG. 4 illustrates an example prior art "tree-structured" dynamic digital encoder 32 as taught by Welz et al. Encoder 32 employs a tree-like network of switching blocks $S_{i,j}$ for systematically converting an N+1 level data x[n] that may have any integer value between O and N (inclusively) into a set of N bits {x1[n]–xN[n]} wherein the number of bits in the output bit set that are a "1" matches the current value of input data x[n]. The value of N may be any power of 2. For any value of N, encoder 32 requires $b=\log_2(N)$ layers of switching blocks $S_{i,j}$ with each layer i consisting of $2^{b-i}$ switching blocks $S_{i,j}$. In the example of FIG. 4, N=8 and b=3. Each switching block $S_{i,j}$ is called a "radix-2" switching block because it produces two digital output words in response to a single digital input word. The sum of values of its two digital output words equals the value of its digital input word.

Figure 5:
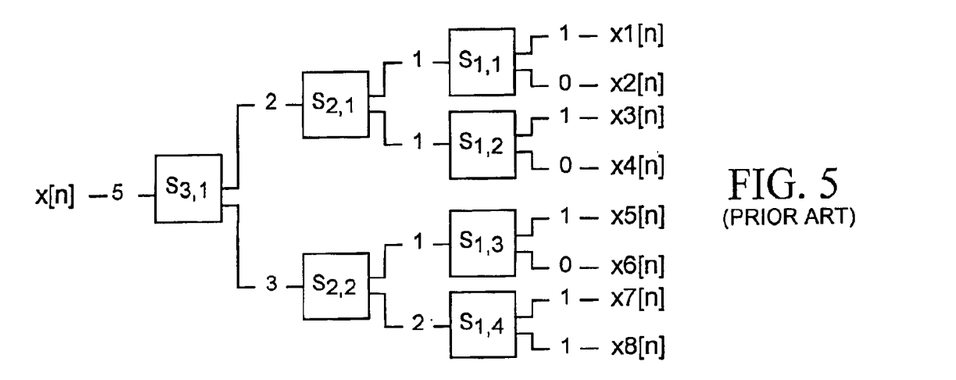

FIG. 5 shows an example of one way DEM circuit 32 of FIG. 4 might set bit states of output word {x1[n] . . . x8[n]} in response to an input word x[n] having a value 5. The top layer (layer 3) switching block $S_{3,1}$ distributes its input value 5 to its two outputs as values 2 and 3. Layer 2 switching block $S_{2,1}$, distributes its input of value 2 to its two outputs as values 1 and 1, and layer 2 switching block $S_{2,2}$ distributes its input of value 3 to its outputs as values 1 and 2. The distribution process continues through layer 1 with switching blocks $S_{1,1}$ . . . $S_{1,4}$, distributing their respective inputs to their outputs as shown to produce an output word {x1[n] . . . x8[n]}={10101011} having five 1's.

Each switching block $S_{i,j}$ does not always allocate an input value in the same way each time it receives that input value. For example when a switching block $S_{i,j}$ receives an input value x[n]=5, it might allocate a 3 and a 2, respectively, to its first and second outputs but later, when it next receives an input value x[n]=5, it might allocate a 2 and a 3, respectively to its first and second outputs. By varying the manner in which they allocate their input values, switching blocks $S_{i,j}$ vary the manner in which encoder 32 maps input word x[n] to output word {x1[n] . . . x8[n]}. Thus although encoder 32 will always respond to x[n]=5 by producing an output word {x [n] . . . x8[n]} having five 1's and three 0's, the 1's will not always be in the same bit positions.

Figure 6:
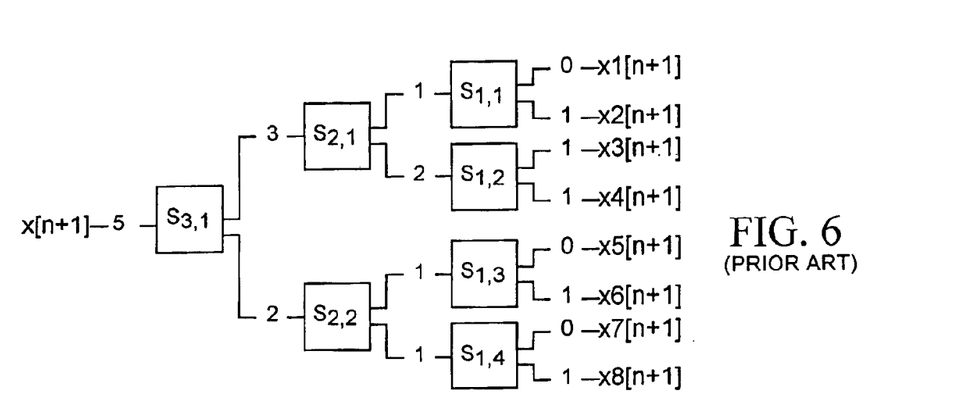

Each switching block $S_{i,j}$ can be implemented as a state machine. Its current input value and its current state together determine how it allocates its current input value between its two outputs. The nature of the algorithm each switching block $S_{i,j}$ implement affects the nature of the mismatch shaping encoder 32 provides, and many suitable algorithms have been proposed. One efficient algorithm tries to evenly distribute the switching block's input to its two outputs. For example when its input is an even number, a switching block $S_{i,j}$ evenly allocates its input value between its two outputs such that, for example an input value of 4 always results in an output data set {2,2}, or an input value of 6 always results in an output set {3,3}. When its input is an odd number, a switching block $S_{i,j}$ makes one output exceed the other by 1 such that, for example, an input of 5 will produce an output set {2,3} or {3,2} and an input of 1 will result in an output set {1,0} or {0,1}. Each switching block $S_{i,j}$ eliminates the average imbalance between its first and second outputs over time by:

1. setting the first output higher than the second in response to an odd input data value when it last set the second output higher in response to an odd input value, and 2. setting the second output higher than the first in response to an odd input data value when it last set the first output higher in response to an odd input value. For example, when a switching block $S_{i,j}$ receives an input sequence [5, 2, 4, 3], its output sequence may be [{3,2}, {1,1}, {2,2} and {1,2}]. Note that for the first odd input (5), switching block $S_{i,j}$ produces output set {3,2} such that its first output exceeds its second output by 1. To compensate for this imbalance when the second odd input (3) arrives, switching block $S_{i,j}$ makes its output set {1,2} so that the second output exceeds the first output by 1, thereby compensating for the previous allocation imbalance. FIGS. 5 and 6 show how encoder 32 of FIG. 4 might set bits of output word {x1[n+1]...x8[n+1]} when successive words x[n] and x[n+1] both equal 5. Note that both output bit sets in FIGS. 5 and 6 have five "1" bits, but they do not occur in the same bit positions.

When the value of N is large, encoder 32 needs $\log_2(N)$ layers of radix-2 switching blocks $S_{i,j}$ and the path delay between its input and output words increases with the number of switching block layers, thereby limiting the operating frequency of any DAC employing encoder 32. What is needed is an improved tree-structured dynamic encoder for an N+1 level DAC that requires fewer than $\log_2(N)$ switching block layers so that the DAC can operate at higher frequencies.

BRIEF SUMMARY OF THE INVENTION

A tree-structured dynamic encoder in accordance with the invention generates an N-bit encoder output word in response to each word of a sequence of binary encoder input words, wherein the number of encoder output word bits of value 1 equals a value of the encoder input word. Positions of bits of value 1 within each encoder output word vary to provide mismatch-shaping when the encoder bits are pseudorandomly selected.

The dynamic encoder includes a tree of switching blocks, each for dynamically encoding a block input word into a set of output words, each having fewer bits than the block input word. A sum of values of the output words of each switching block equals a value of that switching block's input word. A switching block of the highest layer of the tree receives each successive encoder input word as its block input word, and each switching block of each layer of the tree other than its lowest layer supplies each of its output words as a block input word to a separate switching block of a next lower layer of the tree. Each switching block of the lowest layer of the tree generates single-bit block output words, each forming a separate bit of the N-bit encoder output word.

In accordance with the invention, at least one of the switching blocks produces more than two output words. For example, when N is a power of four, each switching block is suitably a "radix-4" switching block produces four output words in response to each input word. Such an encoder requires only $\log_4(N)$ layers of switching blocks. When N is a power of two, but not a power of four, the top level switching block may be a "radix-2" switching block generating two output words while all other switching blocks may be radix-4 switching blocks. Such an encoder would require a total of $1+\log_4(N/1)$ switching block layers. Prior art dynamic encoders employing only radix-2 switching blocks require $\log_2(N)$ switching block layers. By reducing the number of switching block levels required, the invention increases a dynamic encoders maximum allowable operating frequency.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

The invention relates to a mismatch-shaping, dynamic encoder suitable for use in a multiple-bit digital-to-analog converter (DAC). While the drawings and the specification below describe exemplary embodiments of best modes of practicing the invention, those of skill in the art will appreciate that other modes of practicing the invention are possible. The claims appended to this specification therefore define the true scope of the invention.

As discussed above in connection with FIG. 3, a dynamic digital encoder is useful in a multiple bit digital-to-analog converter (DAC) 24 including a summing amplifier 31 for summing outputs of a set of single-bit DACs 30 to produce an analog output signal y[n]. A dynamic digital encoder 20 converts an input word x[n] into an output word {x1[n]–x8[n]} having a number of bits of value 1 equal to the value of input word x[n]. By appropriately scrambling bit-patterns of successive words {x1[n]–x8[n]} supplying input bits to DACs 30, dynamic digital encoder 20 can shape the distribution of frequency components in output signal y[n] arising from mismatches in DACs 30 so that those frequency components can be filtered out of y[n]. Also as discussed above in connection with FIG. 4, a typical prior art "tree-structured" dynamic encoder 32 employs a $\log_2(N)$ layer tree of one input/two output (radix-2) switching blocks to dynamically encode an N-level input word into an N-bit output word. Since the path delay through a tree-structured dynamic encoder 32 increases with the number of switching block layers, and since the encoder's maximum operating frequency is inversely related to its path delay, reducing the number of switching block layers increases the encoder's maximum operating frequency.

Dynamic Encoder Architecture

Figure 7:
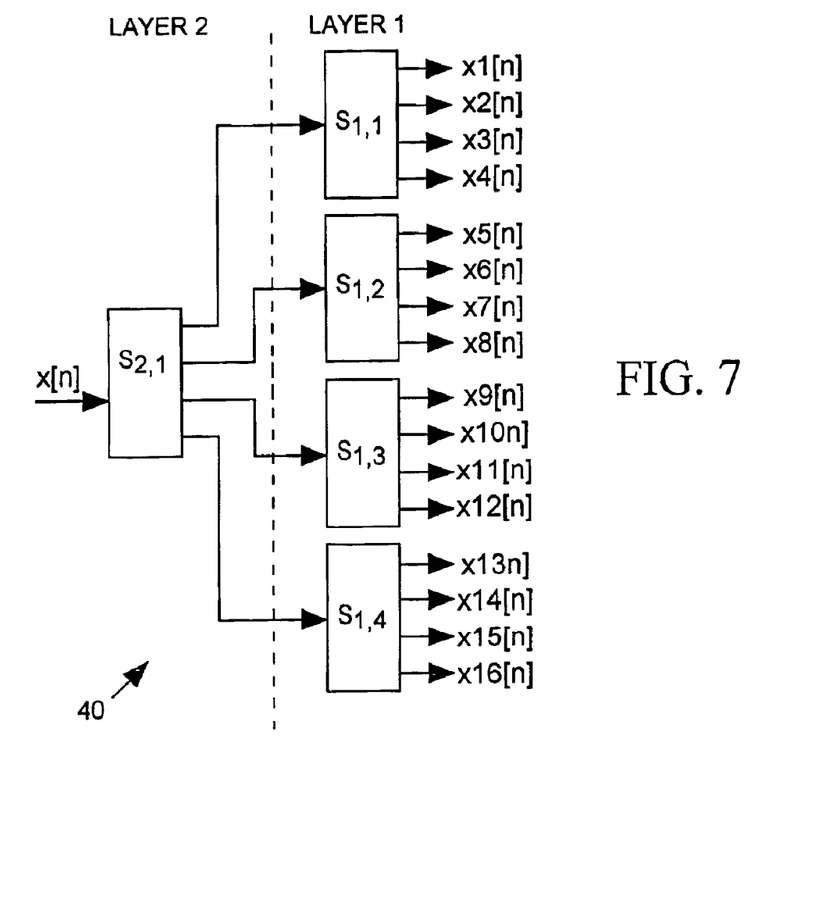
FIGS. 7 and 8 are block diagrams of example dynamic encoders in accordance with the invention.

A tree-structured dynamic encoder in accordance with the invention employs switching blocks producing more than two output words to reduce the number of levels of switching blocks, thereby increasing the maximum operating frequency of the encoder. For example FIG. 7 illustrates an N=16 dynamic encoder 40 in accordance with the invention including a first layer of four output ("radix-4") switching blocks $S_{1,1}$–$S_{1,4}$ and a second layer of one radix-4 switching block $S_{2,1}$. While encoder 40 requires only two switching block layers, a prior art N=16 tree-structured encoder employing only two output ("radix-2") switching blocks would require four switching block layers.

Figure 8:
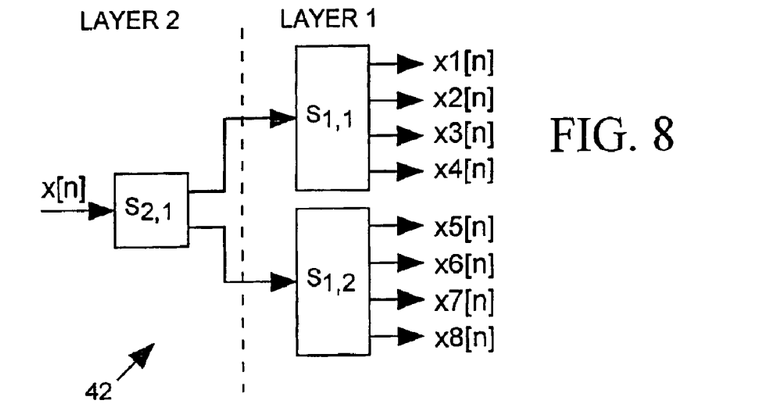

When N is a power of 2, but not a power of 4, an encoder in accordance with the invention requires only $\log_4(N/2)$ layers of radix-4 switching blocks and a single top layer radix-2 switching block. For example FIG. 8 illustrates a 9-level (N=8), tree-structured encoder 42 in accordance with the invention employing two layer 1 radix-4 switching blocks $S_{1,1}$ and $S_{1,2}$ and a single layer 2 switching block $S_{2,1}$. Comparing FIGS. 4 and 8, we see that prior art N=8 encoder 32 requires three switching block layers while encoder 42 requires only two switching block layers. Thus encoder 42 of FIG. 8 would have a lower path delay and higher operating frequency than prior art encoder 32 of FIG. 4.

Switching Block Architecture

A tree-structured dynamic encoder in accordance with the invention employs at least one radix-R switching block having one input word and producing R output words, where the sum of values of the block output words equals a value of the block input word and where R>2. When the integer value V of the block input word is of value 0 or is a multiple of R, all its output words suitably are of value, V/R. But when a switching block's input word value V is other than 0 or a multiple of R, values of its R output words may differ by as much as 1 from each other, with the integer value of each output word being slightly larger or smaller than the non-integer value of V/R. For example each radix-4 switching block $S_{1,1}$ an the it layer i of encoder 40 or 42 of FIG. 7 receives a (2k+1) Ybit block input word and produces four (2k−1)-bit output words. When the value V of an input word to any switching block $S_{i,j}$ is zero or a multiple of four, all of its output words have the same value, V/4. Otherwise, each of its four output words will be slightly larger or smaller than V/4. When the value V of an input word to any switching block $S_{i,j}$ is other than a multiple of four, the sum of values of its R block output words is equal to the value of the block input word, but the value of each individual block output word is other than solely a function of the value of the block input word. This allows each switching block of the dynamic encoder to allocate the value of each successive block input word among its R block output words in a manner that provides appropriate mismatch-shaping when the dynamic encoder forms a part of a multiple-bit DAC.

Figure 9:
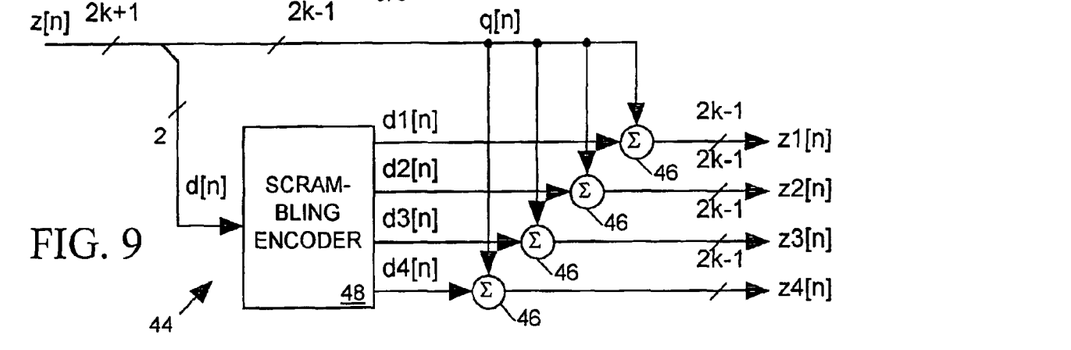
FIG. 9 is a block diagram of an example radix-4 switching block in accordance with the invention for the dynamic encoder of FIG. 7.

FIG. 9 depicts an exemplary embodiment of a radix-4 switching block 44 in accordance with the invention for receiving a (2k+1)bit input word z[n] and producing a set of four (2k−1)bit output words $\{z1[n] \ldots z4[n]\}$. The (2k−1) most significant bits of the block input word z[n] provide an input q[n] to each of a set of summers 46. A scrambling encoder 48 processes the least two significant bits d[n] of input data z[n] to produce a set of four output bits $\{d1[n] \ldots d4[n]\}$ wherein the number of bits $\{d1[n] \ldots d4[n]\}$ of value "1" equals the value of d[n]. Each summer 46 adds a separate bit of the set $\{d1[n] \ldots d4[n]\}$ to q[n] to generate a separate one of the four switching block outputs $z1[n] \ldots z4[n]$. The sum of values of block output words $z1[n] \ldots z4[n]$ will equal the value of input word z[n]. Thus, each output $z[n] \ldots z4[n]$ may have a value of either q[n] or q[n]+1.

The manner in which scrambling encoder 48 maps values of input data d[n] other than 0 to output bit set $\{d1[n] \ldots d4[n]\}$ changes dynamically with [n]. Table 1 shows the possible patterns of $\{d1[n] \ldots d4[n]\}$ bits scrambling encoder 48 may generate for each value of d[n]:

TABLE 1

| d[n] | {d1[n] . . . d4[n]} |
|---|---|
| 0 | (0000) |
| 1 | (0001) (0010) (0100) (1000) |
| 2 | (0011) (0101) (1001) (0110) (1010) (1100) |
| 3 | (0111) (1011) (1101) (1110) |

IIR Filtering Scrambling Encoder

Figures 10, 11:
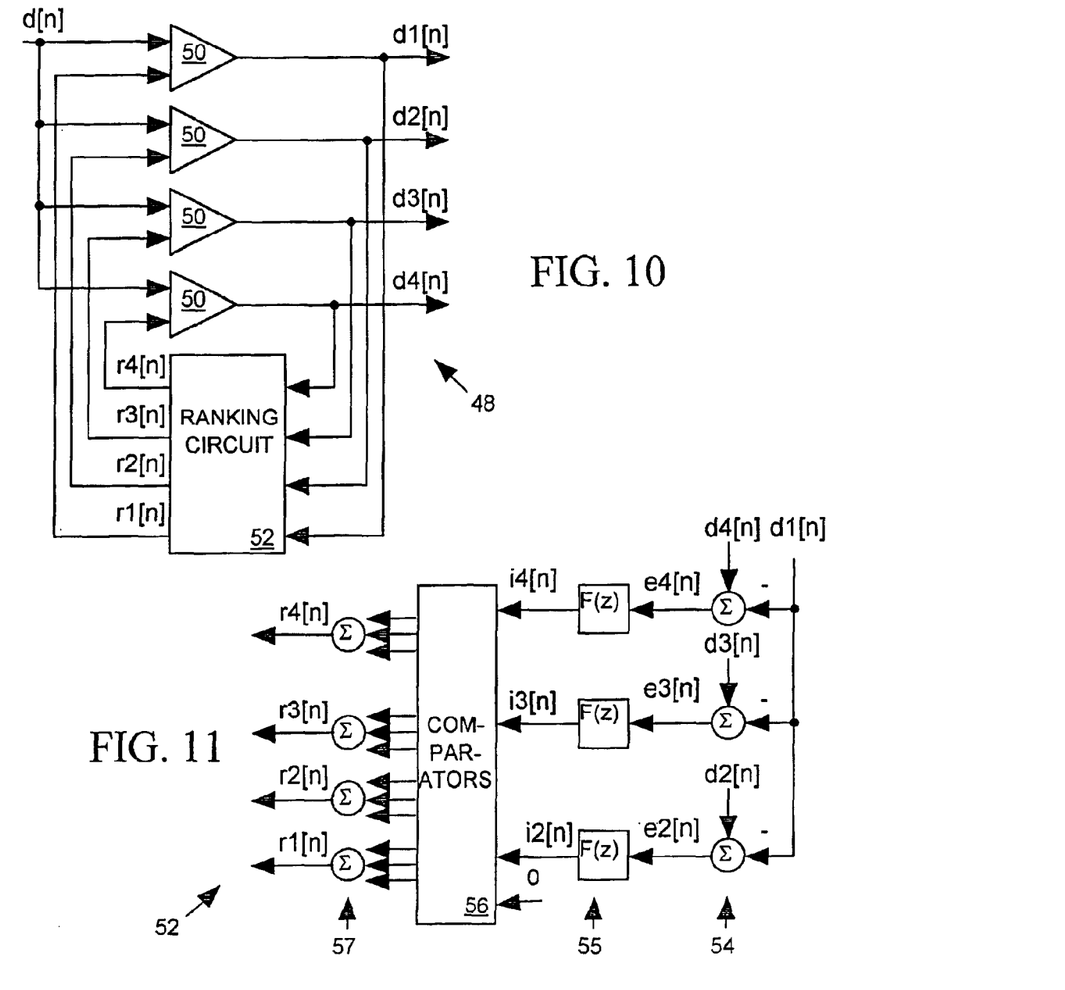
FIG. 10 is a block diagram of an example architecture for the scrambling: encoder of FIG. 9 of the switching block of FIG. 9.
FIG. 11 is a block diagram of an example architecture for the ranking circuit of the scrambling encoder of FIG. 10.

FIG. 10 illustrates a preferred architecture for scrambling encoder 48 of the radix-4 switching block 44 of FIG. 9 in more detailed block diagram form for encoding 2-bit input word d[n] into a set of four output bits $\{d1[n] \ldots d4[n]\}$ wherein the number of 1's in that bit set match the value of d[n] for any value of d[n]=0 to 3. When d[n] is other than 0, encoder 48 scrambles the order of 1's in the bit set $\{d1[n] \ldots d4[n]\}$ to provide appropriate mismatch shaping, for example, when switching block 44 forms a part of a tree-structured dynamic encoder within a multiple-bit DAC.

Scrambling encoder 48 includes a set of four comparators 50, each setting a separate one of scrambling encoder output bits $d1[n]$–$d4[n]$ to a "1" when the value of d[n] exceeds a corresponding one of a set of four "ranking" words $r1[n]$–$r4[n]$ produced by a "ranking" circuit 52. Each of ranking word $r1[n]$–$r4[n]$ may be of any value from 0 to 3, and no two ranking numbers $r1[n]$–$r4[n]$ have the same value. For example when the scrambling encoder input word d[n]=2 and $\{r1[n], r2[n], r3[n], r4[n]\}=\{1,3,0,2\}$ then the set $\{d1[n],d2[n],d3[n],d4[n]\}$ will be $\{1,0,1,0\}$. Ranking circuit 52 sets values of ranking words $r1[n]$–$r4[n]$ based on an analysis of the history of the scrambling encoder output bits $d1[n]$–$d4[n]$ to provide appropriate mismatch shaping.

The scrambling encoder architecture of FIG. 9 is suitable for a radix-4 switching block, but could be scaled up or down to implement a radix-R switching block where R is any power of 2. For example in a radix-8 switching block, scrambling encoder 48 would have eight comparators 50 providing eight output bits $d1[n]$–$d8[n]$ for each 3-bit input word d[n] and ranking circuit 52 would generate eight ranking data words $r1[n]$–$r8[n]$ ranging in value from 0 to 7.

FIG. 11 illustrates a preferred architecture for ranking circuit 52 of FIG. 10 including a set of three summers 54, each for adding scrambling encoder output bit $d1[n]$ to a separate one of scrambling encoder output bits $d2[n]$, $d3[n]$, $d4[n]$ to produce a set of data sequences $e2[n]$, $e3[n]$ and $e4[n]$. A set of three infinite-impulse response (IIR) filters 55 separately filter sequences $e2[n]$, $e3[n]$ and $e4[n]$ to produce a set of sequences $i2[n]$, $i3[n]$ and $i4[n]$. A set of six comparators 56 compare values of $i2[n]$, $i3[n]$, and $i4[n]$ to one another and to 0 to provide inputs to a set of four summers 57, each producing a separate one of ranking numbers $r1[n]$–$r4[n]$. Table 2 indicates the three comparison results each of the four summers 56 sums to produce a corresponding one of ranking numbers $r1[n]$.

TABLE 2

| Ranking Number | Comparison Results Summed | | |
|---|---|---|---|
| r1[n] | i2[n] > 0 | i3[n] > 0 | i4[n] > 0 |
| r2[n] | 0 >= i2[n] | i3[n] > i2[n] | i4[n] > i2n] |
| r3[n] | 0 >= i3[n] | i2[n] >= i3[n] | i4[n] > i3n] |
| r4[n] | 0 >= i4[n] | i2[n] >= i4[n] | i3[n] >= i4n] |

Summers 57 set values of ranking numbers r1[$n$]–r4[$n$] in inverse relation to an order in which their corresponding scrambling encoder output data bits d1[$n$]–d4[$n$] are to be set to 1's based on previous behavior of the encoder output data bits as represented by i2[$n$]–i4[$n$]. The lower the value of a ranking number r1[$n$]–r4[$n$], the higher rank of its corresponding output data bit d1[$n$]–d4[$n$]. If K bits of the set {d1[$n$] . . . d4[$n$]} are to be set to a 1, then comparators 50 drive only the K highest-ranking bits of that set to a 1. Generally the bit of the set {d1[$n$]–d4[$n$]} most likely to be set to a 1 is the bit set to a 1 least often in the recent past so that over time, all bits d1[$n$]–d4[$n$] will be set to a 1 with the same average frequency. In the example ranking circuit of FIG. 11, the particular pattern of summed comparison results eliminates any possibility of a tie in values of r1[$n$]–r4[$n$]. The ranking scheme depicted in Table 2 provides a fixed priority in the order {r1[$n$], r2[$n$], r3[$n$], r4[$n$]} with respect to resolving ties. For example, based on the comparison patterns for r1[$n$] and r2[$n$] described above, ranking circuit 52 will always assign r[n] a lower value than r3[$n$] whenever data i2[$n$]=i3[$n$] indicating that d2[$n$] and d3[$n$] have had a similar pattern of is in the past.

As an alternative to using a fixed, predefined comparing priority for resolving ties as illustrated in Table 2, ranking circuit 52 of FIG. 10 could employ a dithering technique in which ties are resolved by a random number supplied by a random number generator. For example, when the random number is "0," ranking circuit 52 would use i3[$n$]>i2[$n$] as one of the comparisons summed to produce r2[$n$] and would use i2[$n$]>=i3[$n$] as one of the comparisons summed to produce r3[$n$]. This would make r3[$n$] higher than r2[$n$] when i2[$n$]=i3[$n$], thereby giving priority to d2[$n$] over d3[$n$]. Conversely, when the random number is "1", ranking circuit 52 would use i2[$n$]>=i3[$n$] as one of the comparisons counted when computing r2[$n$] and would use i3[$n$]>i2[$n$] as one of the comparisons counted when computing r3[$n$]. This would make r2[$n$] higher than r3[$n$], thereby giving priority to d3[$n$] over d2[$n$] when i2[$n$]=i3[$n$]. Each of the six possible comparisons may rely on a separate random number to break ties.

The transfer function F(z) of filters 55 of FIG. 11 controls the nature of mismatch shaping dynamic encoder 44 of FIG. 9 provides. For example, the following transfer function for each filter 56 will provide first order mismatch shaping:

$$F(z) = \frac{z^{-1}}{1 - z^{-1}}$$

The following transfer function for each filter 56 will provide second-order mismatch shaping:

$$F(z) = \frac{z^{-1}(2 - z^{-1})}{(1 - z^{-1})^2}$$

Filters 55 employing other transfer functions can also provide mismatch shaping.

Data Weighted Averaging Scrambling Encoder

In an alternative embodiment of the invention, scrambling encoder 48 of FIG. 9 can be implemented as a state machine for generating a bit set {d1[$n$]–d4[$n$]} in response to input data d[n]. A state machine can implement various schemes for scrambling the bit order of (d1[$n$]–d4[$n$]} including, for example, a data weighted averaging (DWA) scheme wherein the particular bit(s) of the set {d1[$n$] . . . d4[$n$]} least recently set to 1's are selected as the bit(s) to be the next bit(s) to be set to 1's. Table 3 illustrates a program for a state machine 60 implementing a simple DWA scheme.

TABLE 3

| STATE | d[n] | {d1[$n$] . . . d4[n]} | NEXT STATE |
|---|---|---|---|
| 1 | 0 | 0000 | 1 |
|   | 1 | 0010 | 2 |
|   | 2 | 0110 | 3 |
|   | 3 | 1110 | 4 |
| 2 | 0 | 0000 | 2 |
|   | 1 | 0100 | 3 |
|   | 2 | 1100 | 4 |
|   | 3 | 1101 | 1 |
| 3 | 0 | 0000 | 3 |
|   | 1 | 1000 | 4 |
|   | 2 | 1001 | 1 |
|   | 3 | 1011 | 2 |
| 4 | 0 | 0000 | 4 |
|   | 1 | 0001 | 1 |
|   | 2 | 0011 | 2 |
|   | 3 | 0111 | 3 |

Each state corresponds to a separate bit of the set {d1[$n$] . . . d4[$n$]} that was most recently set to 1. The next value of bit set {d1[$n$] . . . d4[$n$]} and the next state that the state machine enters depends on the incoming value of r[n] and the current state. This simple DWA scheme tends to equalize the average frequency of signals {d1[$n$] . . . d4[$n$]} regardless of the nature of input sequence d[n], but a more complicated a state machine program can increase randomization of bit positions within output bit set {d1[$n$] . . . d4[$n$]} to improve spectral shaping. Dithering can also help increase randomization of "1" bit positions within the output bit set when the state machines' current state is at least partly a function of a random number.

Radix-2 Switching Block Architecture

Figure 12:
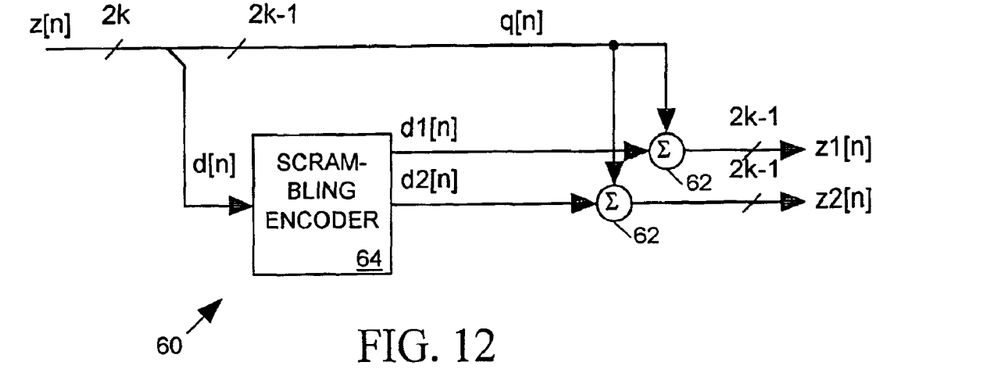
FIG. 12 is a block diagram of an example of a radix-2 switching block for the dynamic encoder of FIG. 7.

FIG. 12 depicts a radix-2 switching block 60, for example suitable for use in a tree-structured dynamic encoder employing only radix-2 switching blocks, or in a tree structured-dynamic encoder such at that depicted in FIG. 7 employing a single radix-2 switching block at its highest layer and radix-4 switching blocks at its lower layers(s). The architecture of radix-2 switching block 60 is analogous to that of the radix-4 switching block of FIG. 9 but includes only two summers 62 producing two switching block output data values z1[$n$] and z2[$n$] and a scrambling encoder 64 supplying only two outputs d1[$n$] and d2[$n$] to summers 62. The lowest significant bit d[n] of a 2k-bit input data z[n] drives an input of scrambling encoder 64 which sets either one of d1[$n$] or d2[$n$] to a 1 when d[n]=1 and otherwise sets d1[$n$]=d2[$n$]=0.

Figure 13:
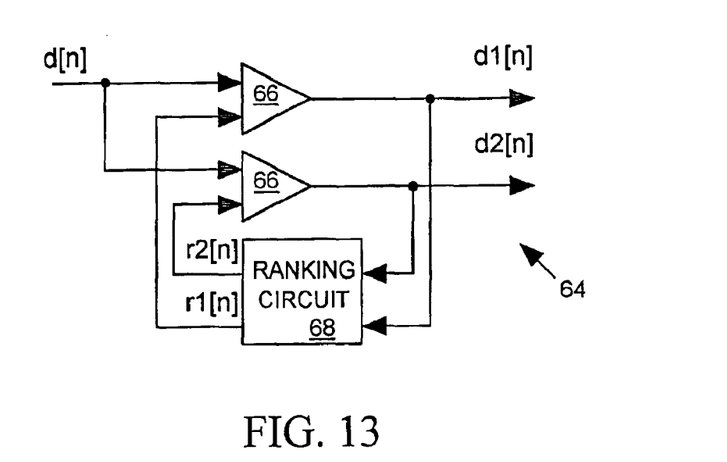
FIG. 13 is a block diagram of an example architecture for the scrambling encoder of the switching block of FIG. 12.

FIG. 13 depicts scrambling encoder 84 of FIG. 12 as including a pair of comparators 66 and a ranking circuit 68. Comparators 66 compare the ranking data outputs of a ranking circuit 68 to r[n] to determine how to set d1[$n$] and d2[$n$]. (AND gates could implement devices 66.) Ranking circuit 68 always sets either r1[$n$] or r2[$n$] to a 1, but not both.

Figure 14:
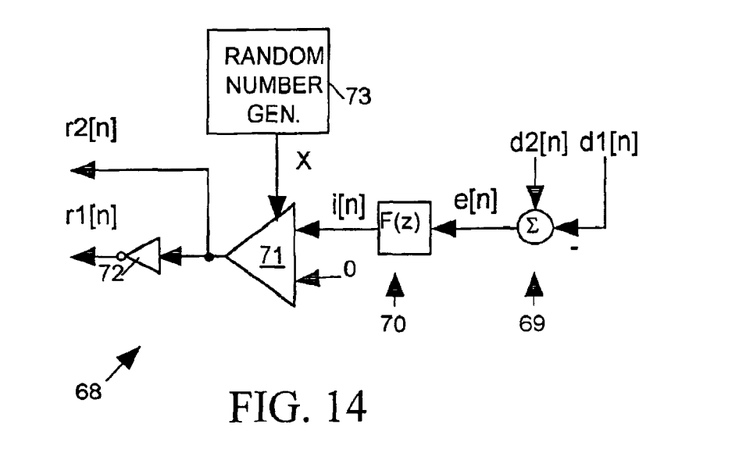
FIG. 14 is a block diagram of an example architecture for the ranking circuit of the scrambling encoder of FIG. 13.

FIG. 14 depicts a dithered version of ranking circuit 68 of FIG. 13 including a summer 69 offsetting d2[$n$] by d1[$n$] to produce data e[n], an IIR filter 70 filtering e[n] to produce data i[n] and a comparator 71 for comparing i[n] to 0 to produce r2[$n$] and an inverter 72 for inverting r2[$n$] to produce r1[$n$]. In this example a random number generator 73 supplies a bit X of randomly set state to comparator 71. When X=0, r2[$n$]=1 when i[n]>=0. When X=1, r2[$n$]=1 when i[n]>0, thereby randomizing the priority d1[$n$] and d2[$n$] receive in the event of ties.

Radix-R Switch

The radix-4 switching block architecture of FIG. 9 can be scaled up or down to form a radix-R switching block, where R is any power of two. For example, a radix-8 switching block would have eight summers 46 and a scrambling encoder 48 having eight output bits instead of four. The scrambling encoder input d[n] would be the three least significant bits of z[n] and q[n] would be the 2k−1 most significant bits of z[n].

Figure 15:
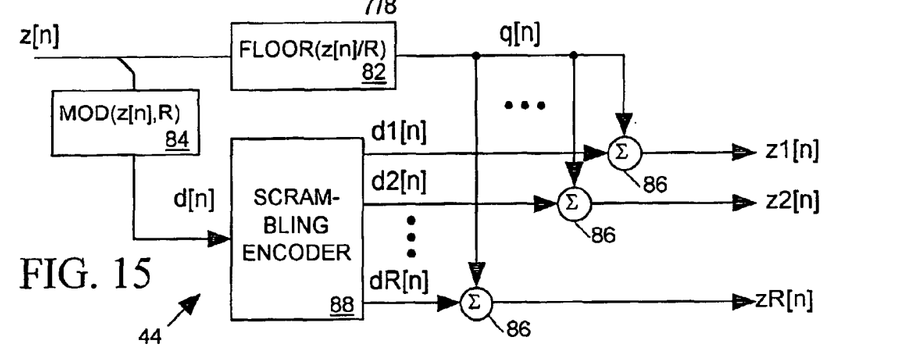
FIG. 15 is a block diagram of an example of a radix-R switching block in accordance with the invention.

FIG. 15 illustrates a radix-R switching block 80 for producing a set of R output words {z1[$n$] . . . zR[$n$]} having a sum equaling a value of an input word z[n], where R may be any integer greater than 1 and need not be power of 2. In circuit 80, a block 82 implements a FLOOR(z/R) function producing data q[n] of value equal to the highest integer number not exceeding z[n]/R and a block 84 implements a MOD(z/R) function producing a value d[n] equal to the remainder of z[n] divided by R. A scrambling encoder 88 encodes d[n] into a set of R bits {d1[$n$] . . . dR[$n$]} and a set of R summers sum each bit of that set with q[n] to produce the set of R output words {z1[$n$] . . . zR[$n$]}. Note that the architecture of the radix-R switching block of FIG. 15 is generally similar to the radix-4 switching block of FIG. 9 except that FIG. 9 does not explicitly depict blocks implementing the FLOOR(z/R) and MOD(z,R) functions. However, the circuit of FIG. 9 implicitly implements the FLOOR(z/R) function by selecting the (2k−1) most significant bits of z[n] as q[n], and implicitly implements the MOD(z,R) function by using selecting the 2 least significant bits of z[n] as d[n]. For a radix-R switching block wherein R is not a power of 2, logic circuits 82 and 84 are needed to implement the FLOOR(z,R) and MOD(z,R) functions.

Figures 16, 17:
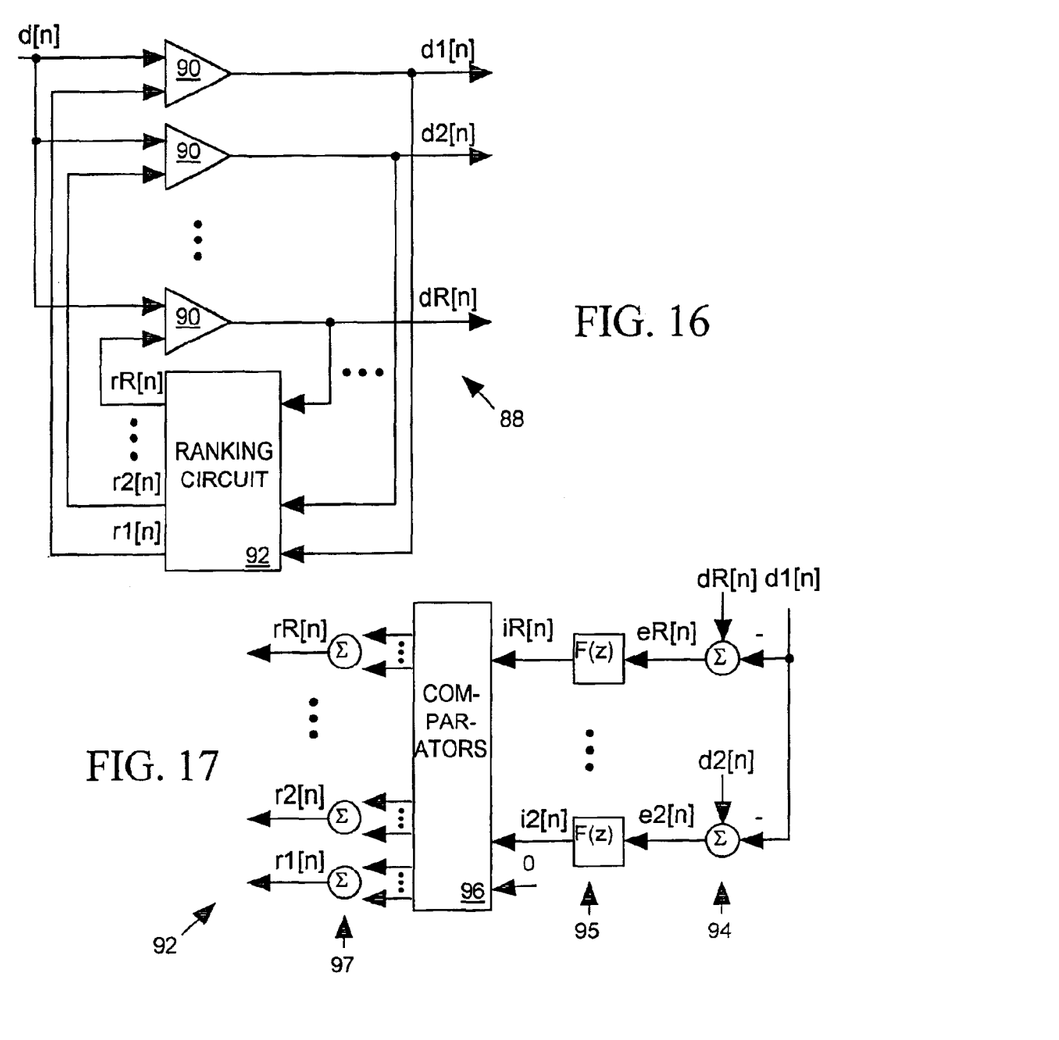
FIG. 16 is a block diagram of an example architecture for the scrambling encoder of the switching block of FIG. 15.
FIG. 17 is a block diagram of an example architecture for the ranking circuit of the scrambling encoder of FIG. 16.

FIG. 16 depicts a suitable embodiment of scrambling encoder 88 including a set of R comparators 50 for setting each bit of the set {d1[$n$] . . . dR[n]} to a 1 when a value of a corresponding one of a set of R ranking words {r1[$n$] . . . rR[n]} produced by a ranking circuit 92 is smaller than the value of d[n]. Ranking circuit 92 sets all ranking words r1[$n$] . . . rR[n] to differing values based on the history of d1[$n$]–dR[n] for preceding values of n. Generally the more frequently comparators 90 have set a bit of the set {d1[$n$] . . . dR[n]} in the past, the more likely lower ranking circuit 92 will set the value of a corresponding ranking word of the set r1[$n$] . . . rR[n] so that over time all bits d1[$n$] . . . dR[n] will be set to a 1 with substantially the same average frequency.

FIG. 17 illustrates ranking circuit 92 of FIG. 16 FIG. 11 including a set of R−1 summers 94, each for adding scrambling encoder output bit d1[$n$] to a separate one of scrambling encoder output bits d2[$n$] . . . dR[n] to produce a set of data sequences {e2[$n$], . . . eR[n]}. A set of R−1 infinite-impulse response (IIR) filters 95 separately filter sequences e2[$n$] . . . eR[n] to produce a set of R−1 sequences i2[$n$]. . . iR[n]. A set of six comparators 96 compare values of i2[$n$] . . . iR[n] to one another and to 0 to provide inputs to a set of R summers 94, each summing R−1 comparator outputs to produce a separate one of ranking numbers r1[$n$]–rR[n]. As discussed above, ranking circuit 92 may employ either a fixed priority system or dithering to resolve ties.

Figure 18:
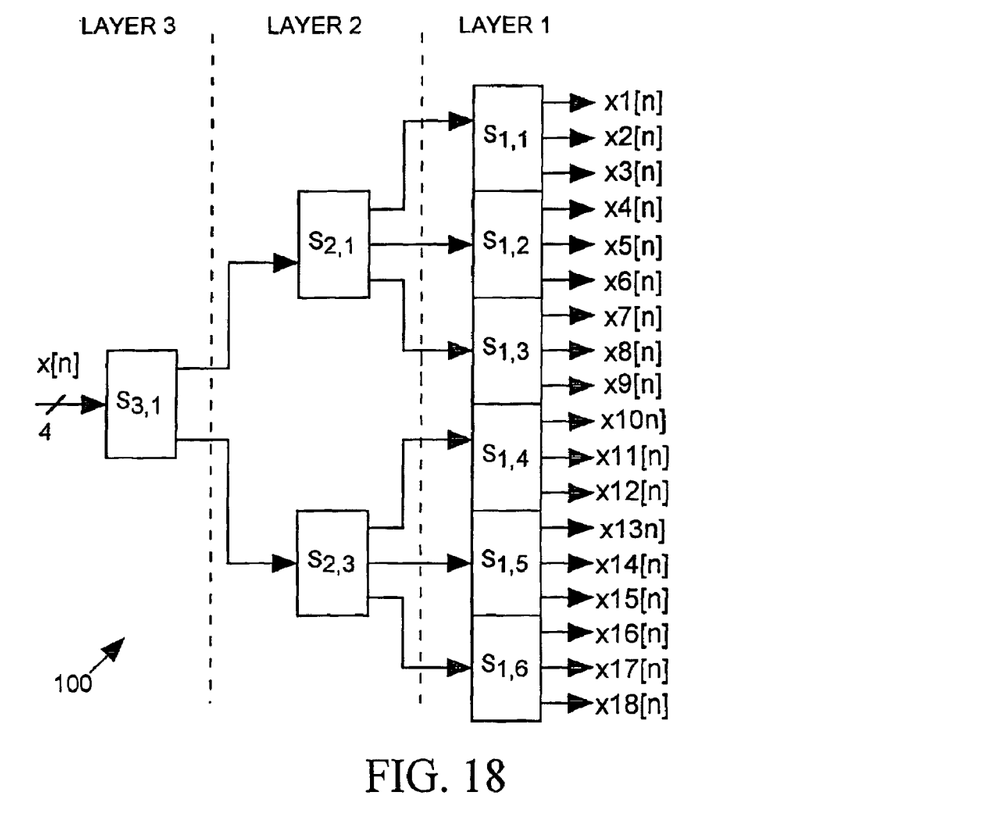
FIG. 18 is a block diagram of an example dynamic encoder in accordance with the invention employing radix-2 and radix-3 switching blocks.

A tree-structured dynamic encoder in accordance with the invention can include radix-R switching blocks having more than one value of R to achieve a desired number of output bits. For example FIG. 18 depicts a dynamic encoder 100 in accordance with the invention for generating an 18-bit output x1[$n$] . . . x18[$n$] in response to a 4-bit (16-level) input data word x[n] representing a value from 0 to 15. The number of bits of output bit set {x1[$n$] . . . x18[$n$]} that are set to a 1 equals the value of x[n]. Thus, only a maximum of 15 of the 18 bits of the set x1[$n$] . . . x18[$n$] are set to a 1 at any time. Dynamic encoder 100 includes a set of six radix-3 switching blocks {$S_{1,1}$ . . . $S_{1,6}$} on layer 1, a set of two radix-3 switching blocks $S_{2,1}$ and $S_{2,2}$ on layer 2, and a single radix-2 switching block $S_{3,1}$ on layer 1.

Figure 19:
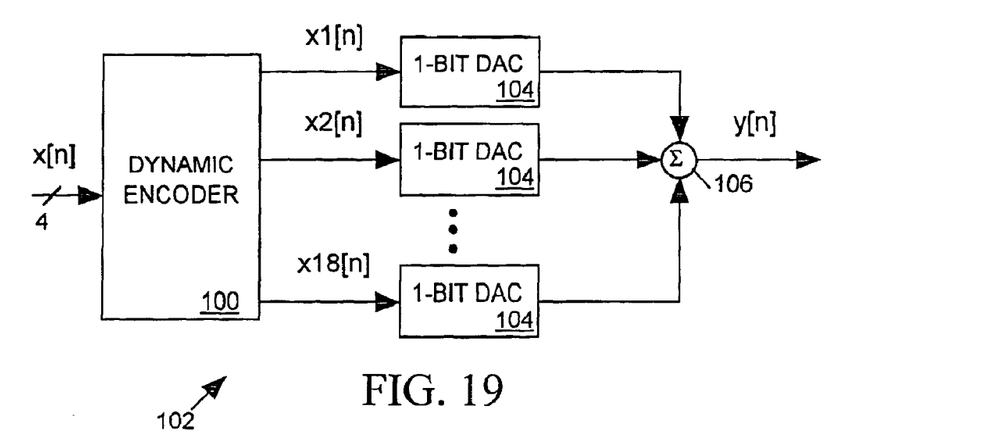

FIG. 19 depicts a mismatch-shaping DAC 102 in accordance with the invention for converting a 4-bit digital input word x[n] into a 16-level analog output signal y[n]. DAC 102 includes the dynamic encoder 100 of FIG. 18 for encoding x[n] into a set of 18 output bits {x1[$n$] . . . x18[$n$]} for driving a set of 18 1-bit DACs 104. A summer 106 sums the 18 analog outputs of DACs 104 to produce the analog output signal y[n] of DAC 102.

The foregoing specification and the drawings depict exemplary embodiments of the best mode(s) of practicing the invention, and elements or steps of the depicted best mode(s) exemplify the elements or steps of the invention as recited in the appended claims. The claims below are therefore intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

What is claimed is:

1. A dynamic encoder for generating an N-bit encoder output word in response to each encoder input word of a sequence of encoder input words, where each encoder input word may represent any of N+1 different levels, where N is an integer greater than 4, the dynamic encoder comprising:

a plurality of switching blocks organized into a tree comprising at least a highest layer and a lowest layer of switching blocks, wherein each switching block receives a block input word and converts it into R block output words, each of the R block output words having fewer bits than the block input word, such that a sum of values of the R block output words equals a value of the block input word, and such that when the value of the block input word is other than a multiple of R, a value of each one of its R block output words is other than solely a function of the value of the block input word, wherein the highest layer of the tree includes a switching block receiving each successive encoder input word of the sequence as its block input word, wherein each switching block of each layer of the tree other than the lowest layer supplies each of its R block output words as a block input word to a separate switching block of a next lower layer of the tree, wherein each block output word of each switching block of the lowest layer of the tree consists of a single bit and forms a separate bit of the N-bit encoder output word, wherein for at least one of the plurality of switching blocks R>2.

2. The dynamic encoder in accordance with claim 1 wherein for every switching block of every layer of the tree other than the highest layer of the tree R>2.

3. The dynamic encoder in accordance with claim 1, wherein for at least one of the switching blocks R=4.

4. The dynamic encoder in accordance with claim 3 wherein for every switching block R=4.

5. The dynamic encoder in accordance with claim 1 wherein for at least one switching block R has a different value than for at least one other switching block.

6. The dynamic encoder in accordance with claim 1 wherein for at least one switching block R is other than a power of 2.

7. The dynamic encoder in accordance with claim 2
   wherein N is a power of two other than a power of four, and
   wherein for every switching block of every layer of the tree other than the highest layer of the tree R=4.

8. The dynamic encoder in accordance with claim 1 wherein at least one switching block has a 2k+1 bit block input word and comprises:
   a scrambling encoder for generating R=$2^r$ scrambling encoder output bits in response to r least significant bits of the at least one switching block's block input word, wherein r>0, wherein a sum of values of scrambling encoder output bits is equal to a value represented by the r least significant bits of the at least one switching block's block input word; and
   R first summers, each corresponding to a separate one of the scrambling encoder output bits, each for generating a separate one of the at least one switching block's block R block output words as a sum of values of its corresponding scrambling encoder output bit and a 2k+1−r most significant bits of the at least one switching block's block input word.

9. The dynamic encoder in accordance with claim 1 wherein at least one switching block has a block input word z[n] and comprises:
   a first circuit for producing data d[n]=MOD(z[n],R);
   a second circuit for producing data q[n]=FLOOR(z[n]/R);
   a scrambling encoder for generating R scrambling encoder output bits in response to data d[n], wherein a sum of values of scrambling encoder output bits is equal to a value represented by d[n]; and
   R first summers, each corresponding to a separate one of the scrambling encoder output bits, each for generating a separate one of the at least one switching block's block R block output words as a sum of values of its corresponding scrambling encoder output bit and q[n].

10. The dynamic encoder in accordance with claim 8 wherein r>=1.

11. The dynamic encoder in accordance with claim 10 wherein r=2.

12. The dynamic encoder in accordance with claim 8 wherein the scrambling encoder comprises:
    a ranking circuit for monitoring the scrambling encoder output bits and for generating a plurality of ranking circuit output words as functions of past values of the scrambling encoder output bits, wherein each ranking circuit output word corresponds to a separate scrambling encoder output bit and wherein all ranking circuit output words have different values; and
    a plurality of comparison circuits, each corresponding to a separate one of the ranking data words, each for generating a corresponding one of the scrambling encoder output bit of a value determined as a result of a comparison between its corresponding one of the ranking data words and a value of the r least significant bits of the at least one switching block's input data word.

13. The dynamic encoder in accordance with claim 12 wherein the ranking circuit comprises:
    a plurality of second summers for generating a plurality of summer output words, each second summer corresponding to a separate one of the scrambling encoder output bits other than a first scrambling encoder output bit and generating a summer output word representing a difference in values of its corresponding encoder output bit and the first scrambling encoder output bit,
    a plurality of digital filters for separately filtering the separate summer output words to produce a plurality of filter output words; and
    at least one comparator for generating the ranking circuit output words as functions of filter output words.

14. The dynamic encoder in accordance with claim 13 wherein each digital filter has a transfer function $$F(z) = \frac{z^{-1}}{1-z^{-1}}.$$

15. The dynamic encoder in accordance with claim 13 wherein each digital filter has a transfer function $$F(z) = \frac{z^{-1}(2-z^{-1})}{(1-z^{-1})^2}.$$

16. A method for generating an N-bit encoder output word in response to each encoder input word of a sequence of encoder input words, wherein each encoder input word may represent any one of N+1 levels, where N is an integer greater than 4,
    a. converting each encoder input word into a set of M generated words, each consisting of fewer bits than the encoder input word, wherein a sum of values of the M generated words equals a value of the encoder input word, and wherein M>1; and
    b. converting each previously generated word into a separate set of R generated words each consisting of fewer bits than the previously generated word, wherein combined values of the R generated words equals a value of the previously generated word, wherein values of the R generated words are other than sole functions of the previously generated word; and
    c. iteratively executing step b until all generated words comprise only a single bit, wherein during each execution of step b, R>1, and wherein for at least one execution of step b, R>2.

17. The method in accordance with claim 16 wherein M>=2.

18. The method in accordance with claim 17 wherein M=4.

19. The method in accordance with claim 18 wherein R=4 during each execution of step b.

20. The method in accordance with claim 16 wherein step b comprises for each previously generated word, the substeps of:
    b1. generating R=$2^r$ scrambling encoder output bits in response to r least significant bits of each previously generated word, wherein a sum of values of the scrambling encoder output bits equals a value represented by the r least significant bits of the previously generated output word, where r>0; and
    b2. generating each word of the set of R generated words as a sum of a corresponding one of the scrambling encoder output bits and a 2k+1−r most significant bits of the previously generated word.

21. The method in accordance with claim 20 wherein r=1.

22. The method in accordance with claim 20 wherein r=2.

23. The method in accordance with claim 20 wherein substep b1 comprises the substeps of:
- b11. monitoring the scrambling encoder output bits and generating a plurality of ranking data words as functions of past values of the scrambling encoder output bits, wherein each ranking circuit output word corresponds to a separate scrambling encoder output bit and wherein all ranking data words have different values; and
- b12. generating each one of the scrambling encoder output bits of a value determined as a result of a comparison between values of a corresponding one of the ranking data words and the r least significant bits of the previously generated output word.

24. The method in accordance with claim 23 wherein substep b11 comprises the substeps of:
- b111. for each scrambling encoder output bit other than a first scrambling encoder output bit, generating a difference word sequence representing a difference in a sequence of values of the encoder output bit and a sequence of values of the first scrambling encoder output bit,
- b112. digitally filtering a corresponding one of the difference words to sequence produce a separate filter output word sequence; and
- b113. generating the ranking data words as functions of words of the filter output word sequences.

25. The method in accordance with claim 24 wherein difference word sequences are filtered at step b112 with a transfer function $$F(z) = \frac{z^{-1}}{1 - z^{-1}}.$$

26. The method in accordance with claim 24 wherein difference word sequences are filtered at step b112 with a transfer function $$F(z) = \frac{z^{-1}(2 - z^{-1})}{(1 - z^{-1})^2}.$$

27. A digital-to-analog converter (DAC) for generating an N+1 level analog DAC output signal in response to each DAC input word of a sequence of DAC input words, wherein each DAC input word may represent any of N+1 different levels, where N is an integer greater than 4, the DAC comprising:
- a plurality of switching blocks organized into a tree comprising at least a highest layer and a lowest layer of switching blocks,
  - wherein each switching block receives a block input word and converts it into R block output words, each of the R block output words having fewer bits than the block input word, such that a sum of values of the R block output words equals a value of the block input word, and such that when the value of the block input word is other than a multiple of R, a value of each one of its R block output words is other than solely a function of the value of the block input word,
  - wherein the highest layer of the tree includes a switching block receiving each successive DAC input word of the sequence as its block input word,
  - wherein each switching block of each layer of the tree other than the lowest layer supplies each of its R block output words as a block input word to a separate switching block of a next lower layer of the tree,
  - wherein each block output word of each switching block of the lowest layer of the tree consists of a single bit,
  - wherein for at least one of the plurality of switching blocks R>2;
- a plurality of 1-bit DACs for converting the signal bit output words of switching blocks of the lowest layer of the tree into a plurality of analog signals; and
- a summer for summing the plurality of analog signals to produce the analog DAC output signal.

28. The DAC in accordance with claim 27 wherein at least one switching block has a 2k+1 bit block input word and comprises:
- a scrambling encoder for generating $R=2^r$ scrambling encoder output bits in response to r least significant bits of the at least one switching block's block input word, wherein r>0, wherein a sum of values of scrambling encoder output bits is equal to a value represented by the r least significant bits of the at least one switching block's block input word; and
- R first summers, each corresponding to a separate one of the scrambling encoder output bits, each for generating a separate one of the at least one switching blocks block R block output words as a sum of values of its corresponding scrambling encoder output bit and a 2k+1− r most significant bits of the at least one switching block's block input word.

29. The DAC in accordance with claim 28 wherein the scrambling encoder comprises:
- a ranking circuit for monitoring the scrambling encoder output bits and for generating a plurality of ranking circuit output words as functions of past values of the scrambling encoder output bits, wherein each ranking circuit output word corresponds to a separate scrambling encoder output bit and wherein all ranking circuit output words have different values; and
- a plurality of first comparators, each corresponding to a separate one of the ranking data words, each for generating a corresponding one of the scrambling encoder output bit of a value determined as a result of a comparison between its corresponding one of the ranking data words and a value of the r least significant bits of the at least one switching block's input data word.

30. The DAC in accordance with claim 29 wherein the ranking circuit comprises:
- a plurality of second summers for generating a plurality of summer output words, each second summer corresponding to a separate one of the scrambling encoder output bits other than a first scrambling encoder output bit and generating a summer output word representing a difference in values of its corresponding encoder output bit and the first scrambling encoder output bit,
- a plurality of digital filter for separately filtering the separate summer output words to produce a plurality of filter output words; and
- at least one second comparator for generating the ranking circuit output words as functions of filter output words.

31. The DAC in accordance with claim 30 wherein each digital filter has a transfer function $$F(z) = \frac{z^{-1}}{1-z^{-1}}.$$

32. The DAC in accordance with claim 30 wherein each digital filter has a transfer function $$F(z) = \frac{z^{-1}(2-z^{-1})}{(1-z^{-1})^2}.$$

33. The DAC in accordance with claim 27 wherein at least one switching block has a block input word z[n], where n is a discrete time index, and comprises:

a first circuit for producing data d[n]=MOD(z[n],R);

a second circuit for producing data q[n]=FLOOR(z[n]R);

a scrambling encoder for generating R scrambling encoder output bits in response to values of data d[n], wherein a sum of values of scrambling encoder output bits is equal to a value represented by data d[n]; and R first summers, each corresponding to a separate one of the scrambling encoder output bite, each for generating a separate one of the at least one switching block's block R block output words as a sum of values of its corresponding scrambling encoder output bit and q[n].

\* \* \* \* \*